United States Patent [19]

Weiner

[11] 3,883,824

[45] May 13, 1975

[54] DIELECTRIC-YIG TUNER FOR BULK OSCILLATORS

[75] Inventor: Maurice Weiner, Ocean Township, N.J.

[73] Assignee: The United States of America as represented by the Secretary of the Army, Washington, D.C.

[22] Filed: July 30, 1974

[21] Appl. No.: 493,000

[52] U.S. Cl. .............. 331/107 G; 331/96; 333/83 R

[51] Int. Cl. .............................................. H03b 7/14

[58] Field of Search... 333/83 R; 331/107 R, 107 G, 331/99, 101, 96

[56] References Cited

UNITED STATES PATENTS

| | | | |
|---|---|---|---|
| 3,544,918 | 12/1970 | Venator, Jr. | 331/107 G |
| 3,546,624 | 12/1970 | Omori | 331/107 G |
| 3,573,659 | 4/1971 | Dydyk | 331/107 G |
| 3,576,503 | 4/1971 | Hanson | 331/107 G |
| 3,798,578 | 3/1974 | Konishi et al. | 333/83 R |

OTHER PUBLICATIONS

Tunable Gunn-Diode Oscillators S. Marriott Design Electronics, Vol. 8, No. 2, Nov. 1970, pgs, 72–74, 112.

RCA Tech. Note No. 881, Mar. 5, 1971, R. Schlafli.

*Primary Examiner*—John Kominski

*Attorney, Agent, or Firm*—Nathan Edelberg; Robert P. Gibson; Arthur L. Bowers

[57] ABSTRACT

A system is disclosed in which a bulk oscillator is tuned to an oscillation frequency by a dielectric resonator and YIG sample. The bulk oscillator is mounted in a wave guide adjacent to the dielectric resonator and YIG sample. The bulk oscillator is biased to a point of negative resistance. An adjustable magnetic field is employed to alter the characteristics of the YIG sample and therefore electrically tune the frequency of oscillation of the bulk oscillator.

10 Claims, 1 Drawing Figure

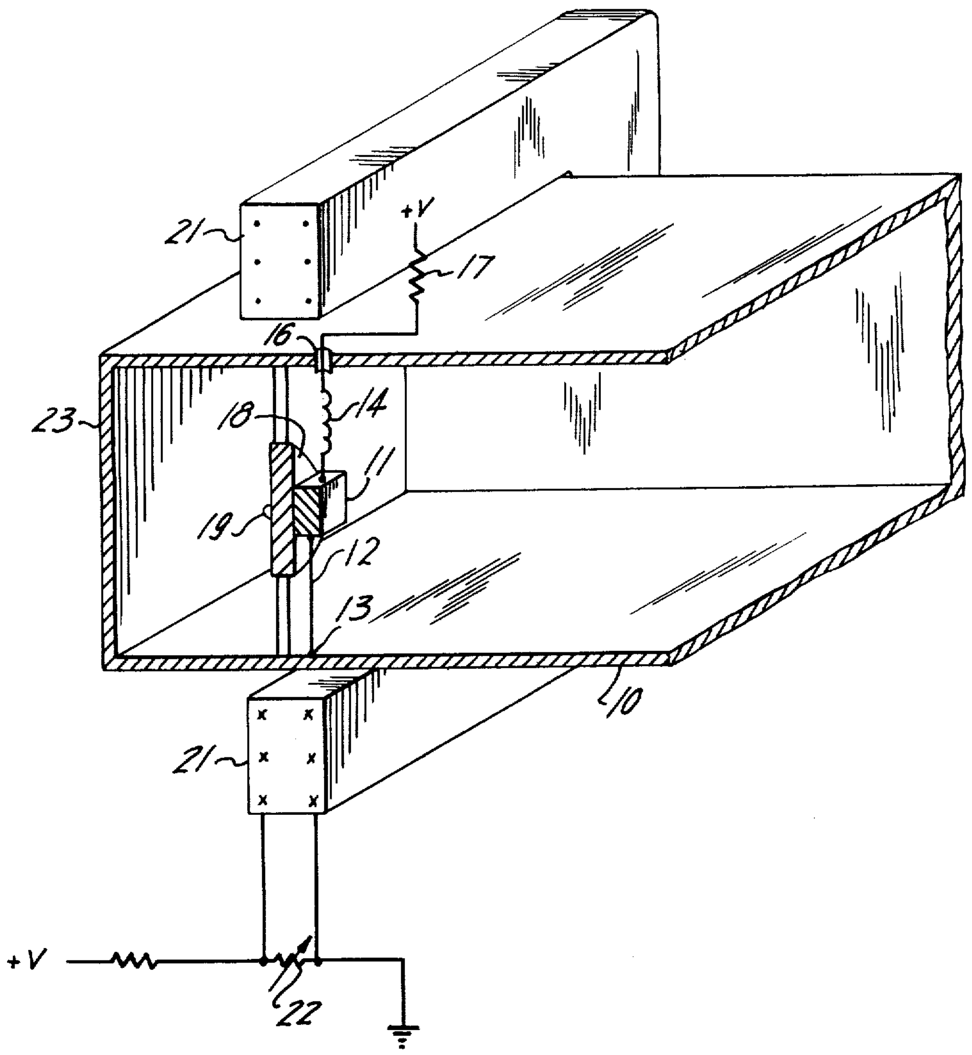
21
+V
17
16
14
18
11
23
19
12
13
10
21
+V
22

DIELECTRIC-YIG TUNER FOR BULK OSCILLATORS

The invention described herein may be manufactured and used by or for the Government for governmental purposes without the payment of any royalties thereon or therefor.

FIELD OF THE INVENTION

This invention relates to RF oscillators and particularly to RF oscillators tunable by YIG samples.

BACKGROUND OF THE INVENTION

Bulk oscillators such as LSA diodes are non-linear devices which have a region in their characteristic which exhibit a negative resistance. It is well known that these devices, if biased into their negative resistance region, will oscillate at a frequency determined by external circuitry. In the past, bulk diodes have been mounted in microwave cavities loaded by YIG samples. Magnetic biasing fields have been applied to the YIG samples to alter the resonant frequency at which the bulk oscillator oscillates.

Oscillators, as discussed above, can have their frequency of oscillation varied by approximately 5% as a result of varying the magnetic field.

People have employed YIG samples adjacent to dielectric resonators for providing electronically tunable resonators in microwave systems.

BRIEF DESCRIPTION OF THE INVENTION

In accordance with this invention it has been found that a bulk oscillator can be electronically tuned over a 20% frequency range by employing a dielectric resonator in combination with a YIG sample to determine the frequency of operation of a biased bulk oscillator.

It has been found that an adjustable magnetic field applied to the YIG sample will produce the 20% variation rather than the 5% variation achievable heretofore.

DESCRIPTION OF THE DRAWING

For a more complete understanding of this invention, reference should be made to the following detailed description and drawing in which the sole FIGURE shows a perspective view in section of the system constructed in accordance with the teachings of this invention.

DETAILED DESCRIPTION OF THE INVENTION

Referring now to the sole FIGURE we see a microwave waveguide 10 having a bulk oscillator 11 mounted therein. It should be understood that the bulk oscillator, though shown in a waveguide, may also be situated in a strip transmission line or other rf propagating structure. The bulk oscillator 11 can be, for example, an LSA or a GUNN diode. The bulk oscillator 11 is connected electrically by a conductor 12 to a grounding point 13. An inductor 14 connects the other side of the bulk oscillator 11 through a feed-through 16 and resistor 17 to a source of voltage. The values of the voltage source, the resistor 17 and the other associated circuitry biases the bulk oscillator 11 into a negative resistance portion of its characteristic.

A dielectric resonator 18 is mounted adjacent to the bulk oscillator 11. In the preferred embodiment of this invention, the dielectric resonator 18 is made from either titanium dioxide or strontium titanite. The dielectric resonator 18 is preferably a disk of the materials discussed above and has a diameter which is less than .200 inches and a thickness of less than .020 inches. These dimensions allow miniaturization of the tunable resonator below the sizes heretofore achievable.

A YIG sample 19 is mounted adjacent to the disk resonator 18. In this embodiment the YIG sample 19 is actually cemented to the disk resonator 18. The diameter of the YIG sample is approximately .035 inches or less.

A magnetic field producing coil 21 produces a field inside the waveguide 10 in the region where the YIG sample 19 is located. The magnetic field of the coil 21 is adjusted by a voltage divider 22.

In operation the bulk oscillator 11 oscillates in its negative resistance region. The electric fields produced thereby interact with the dielectric resonator 18 which loads the bulk oscillator 11 to induce it to oscillate at the frequency determined by the resonator 18. The disk resonator 18 produces fields which interact with the YIG sample 19 to modify the modes of response thereof in accordance with the magnetic field induced upon the YIG sample 19. In this way the modification of the magnetic field across the YIG sample 19 affects the electric field properties of the dielectric resonator 18 which, in turn, controls the frequency of oscillation of the bulk oscillator 11.

In the past, people have employed YIG samples such as YIG sample 19, to control the frequency of oscillation of bulk oscillators such as bulk oscillator 11 in waveguides or other such structures which define an electromagnetic field bounding region. Coils have been employed to vary the magnetic field for providing an interaction between the YIG sample and the bulk oscillator. In accordance with this invention, it has been found that by interposing a dielectric resonator, such as dielectric resonator 18, the effects of the YIG sample upon a dielectric resonator will create a larger percentage change in the electronic frequency variability of the bulk oscillator 11. The mechanism by which this occurs is the variation of a magnetic field for interacting with a disk resonator to modify the electric field properties thereof.

It should be understood that the oscillations from the bulk oscillator 11 travel down the waveguide 10 to the right as shown in the FIGURE. The waveguide 10 is shorted by a shorting member 23 at the left side thereof. The bulk oscillator 11 is located at a distance therefrom less than or equal to a quarter wavelength at the frequency of oscillation. Energy transmitted to the left is reflected back down towards the right so that the device shown in the FIGURE provides energy at the frequency controlled by the elements disclosed above at the output of the waveguide 10. It should, of course, be understood that impedance matching elements are employed to match the waveguide 10 to a circuit for utilization of the energy derived therefrom. For example, a tapered waveguide could be employed to provide such impedance matching.

It should be understood that while the invention has been discussed with respect to a particular embodiment thereof, numerous others will become obvious to those of ordinary skill in the art in light thereof.

What is claimed is:

1. In combination:

means for defining an electromagnetic field bounding region:

a device mounted in said electromagnetic field bounding region; said device having a negative resistance portion on its characteristic;

means for biasing said device into said negative resistive portion of its characteristic;

a dielectric resonator mounted in said electromagnetic field bounding region adjacent to said device;

a YIG sample mounted in said electromagnetic field bounding region adjacent to said dielectric resonator; and means for providing an adjustable magnetic field to said YIG sample.

2. The combination as defined in claim 1 in which said device is an LSA diode.

3. The combination as defined in claim 1 in which said dielectric resonator is a disk made from a material taken from the group which comprises: titanium dioxide and strontium titanite.

4. The combination as defined in claim 3 in which said disk has a diameter which is less than .200 inches and a thickness of less than .020 inches.

5. The combination as defined in claim 4 in which said YIG sample has a diameter of less than .035 inches.

6. The combination as defined in claim 1 in which said device is a GUNN diode.

7. The combination as defined in claim 6 in which said dielectric resonator is a disk made from a material taken from the group which comprises: titanium dioxide and strontium titanite.

8. The combination as defined in claim 7 in which said disk has a diameter which is less than .200 inches and a thickness of less than .020 inches.

9. The combination as defined in claim 8 in which said disk has a diameter which is less than .200 inches and a thickness of less than .020 inches.

10. The combination as defined in claim 1 in which said means for defining said region is a shorted waveguide of said device, said dielectric resonator, and said YIG sample are mounted in said shorted waveguide a distance from the shorted end thereof less than a quarter wavelength at a center operating frequency.

* * * * *